May 19, 1964 J. W. GRAY 3,134,027

PRECISION INTEGRATOR

Filed Nov. 15, 1960 2 Sheets-Sheet 1

INVENTOR.
JOHN W. GRAY

BY H. L. Mackey

ATTORNEY.

May 19, 1964 J. W. GRAY 3,134,027

PRECISION INTEGRATOR

Filed Nov. 15, 1960

2 Sheets-Sheet 2

INVENTOR.
JOHN W. GRAY

BY H. S. Mackey

ATTORNEY.

3,134,027
PRECISION INTEGRATOR

John W. Gray, Pleasantville, N.Y., assignor to General Precision, Inc., a corporation of Delaware Filed Nov. 15, 1960, Ser. No. 69,514
1 Claim. (Cl. 307—88.5)

This invention relates to integrators of the resistance-capacitance type commonly known as feedback time constant integrators or as Miller feedback integrators. Such an integrator consists of an amplifier fed through a resistor, with a capacitive negative feedback path around the amplifier.

A resistance-capacitance (RC) integrator generally performs integration with considerable error. In fact, it is only when both voltage and current at the amplifier input are zero that integration is performed without error. This implies that the amplifier has infinite gain.

The present invention provides an integrator circuit which minimizes the inherent errors of this type of integrator. The circuit contains an input resistor to which the input signal is applied. The signal is applied from this resistor to a modulator which converts the signal to an alternating current signal. This alternating current signal is amplified in an alternating current amplifier, then is synchronously demodulated, then may be further amplified in a direct-coupled amplifier. The output is fed back to the modulator input in the degenerative or negative feedback sense through a capacitor.

This design provides an integrator which may be made to operate very nearly as an ideal integrator. Errors are minimized particularly by increasing the gain of the alternating current amplifier, by increasing its input impedance, and by employing a specialized modulator.

The components of this circuit may have any of several forms. Specifically, either of the two amplifiers may employ either electronic tubes or semiconductor devices such as transistors. The modulator and demodulator must be of the commutating variety and must operate in synchronism with each other. They may employ choppers (electromagnetic vibrating relays), diodes of the electronic or semiconductor type, or any other form of periodically opened and closed device.

The modulator which is preferred for use in this invention employs a novel, low-leakage circuit containing four, semiconductor diodes. This modulator is classified as commutating, but never grounds or short-circuits the input signal. In addition, this modulator causes practically no attenuation of the input signal.

The preferred demodulator also employs four semiconductor diodes in a form of switch circuit.

Although any type of alternating current amplifier may be employed, the one employed as an example in the detailed description is of a novel type completely described in patent application Serial No. 69,206, filed November 14, 1960. This amplifier has the advantages of high input impedance, high and stable gain, high linearity and low distortion, and low output impedance.

The direct-coupled amplifier may be of any form, but the amplifier used as illustration in the detailed description has several advantages which improve the accuracy of the integrator. These advantages include high input impedance and high gain. The amplifier employs internal Miller feedback to provide a smoothed direct voltage output.

The purpose of this invention is to provide a high precision RC integrator, with the errors inherent in this form of integrator substantially minimized.

A further understanding of this invention may be secured from the detailed description and accompanying drawings, in which.

Figure 1:
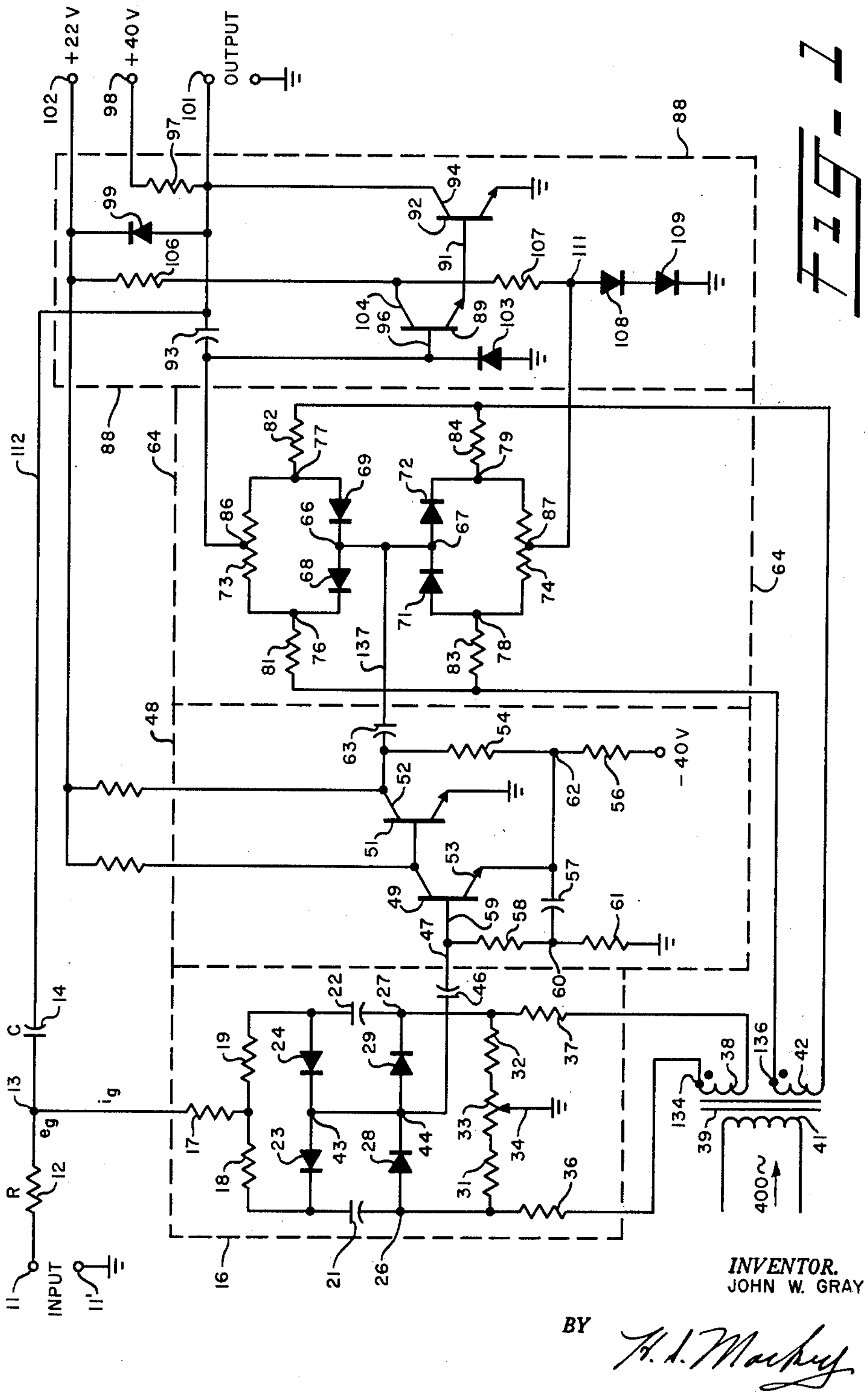
FIGURE 1 is a schematic diagram of one form of the invention.

Referring now to FIGURE 1, one input signal terminal 11 is connected through an input resistor 12 to an input junction 13. The other input signal terminal 11' is grounded. The junction 13 is connected to a principal integrating or feedback capacitor 14 and also to the input of a commutating modulator delimited by the dashed outline 16. The input junction 13 thereof is connected through a resistor 17 and two identical resistors 18 and 19 to two identical capacitors 21 and 22. The resistors 18 and 19 are also connected to two semiconductor silicon diodes 23 and 24 connected in series aiding relationship. The other terminals 26 and 27 of the capacitors 21 and 22 are connected to two silicon diodes 28 and 29, also connected in series aiding relationship. These terminals also constitute the end terminals of the series circuit consisting of two resistors 31 and 32 and a potentiometer 33. The slider 34 of the potentiometer 33 is grounded. The two terminals 26 and 27 are also connected through two equal resistors 36 and 37 to a secondary winding 38 of a transformer 39. The transformer primary winding 41 is connected to a power source having a frequency, for example, of 400 c.p.s. The transformer 39 has a second identical secondary winding 42. These secondary windings may conveniently have open circuit potentials of 26 volts.

The common junction 43 of diodes 23 and 24 and the common junction 44 of diodes 28 and 29 are connected together and are likewise coupled through a capacitor 46 to the modulator output conduuctor 47.

The four diodes are preferably silicon diodes selected to have the same forward potential drops at the same current.

The output conductor 47 is connected to the input of an alternating current amplifier enclosed by the dashed lines 48. This amplifier contains two transistors 49 and 51, each connected as a common-emitter amplifier. A direct voltage degenerative feedback path comprising the resistor 54 is connected between the collector 52 and emitter 53. An alternating voltage degenerative feedback path is provided which extends from collector 52 through resistor 54, capacitor 57 and resistor 58 to the base 59, with resistors 56 and 61 added to control the amount of feedback. A bootstrap effect is secured by the connection of base 59 to the junction 60, increasing the input impedance. The amplifier output is taken from collector 52 through capacitor 63.

The alternating current amplifier output is applied from capacitor 63 to a demodulator enclosed in the dashed lines 64, where the signal is reconverted to direct current. The input signal to the demodulator is applied to the common junctions 66 and 67 of two pairs of semiconductor diodes 68 and 69, and 71 and 72, each pair being connected in series aiding relationship. These diodes are preferably, but not necessarily, silicon diodes. The diodes 68 and 69 are shunted by a center-tapped resistor 73 and diodes 71 and 72 are shunted by a center-tapped resistor 74. The end terminals 76, 77, 78 and 79 of the diode pairs are connected to the transformer secondary winding 42 through resistors 81, 82, 83 and 84. The demodulator outputs are taken from the center taps 86 and 87.

The demodulator direct-current output signal is applied to a direct-coupled amplifier shown within the dashed lines 88. This amplifier includes a transistor 89 connected as an emitter follower, with its output connected to the base 91 of a second transistor 92 in a common-emitter connection. This amplifier thus inverts the signal. A large capacitor 93 is connected from the collector 94 to the base 96, constituting a Miller feedback for the purpose of smoothing or filtering out the 400 c.p.s. demodulator ripple. Although this capacitor integrates, there is far too much base 96 current to permit exact integration, and this simple Miller circuit therefore cannot perform the function of the entire precision integrator.

Amplifier output, which is also the integrator output, is taken from the collector 94, having a bias potential applied thereto through a resistor 97 connected to a positive 40-volt terminal 98. A semiconductor diode 99 is connected between the amplifier output terminal 101 and a 22-volt potential source terminal 102. This diode limits the output voltage to +22 volts while maintaining the gain secured by using +40-volt collector bias at all voltages between zero and +22 volts. A semiconductor diode 103 is connected between the base 96 and ground to protect transistor 89 from excessive negative voltage input.

The collector 104 is biased by being connected to an intermediate terminal of a potential divider consisting of resistors 106 and 107 connected between the +22 volt terminal and ground. Intervening between the resistor 107 and ground are two semiconductor diodes 108 and 109, with the resistor junction 111 connected to an output terminal 87 of the demodulator 64. The function of these diodes is to make the average output voltage of the two demodulator output terminals 86 and 87 equal. This is done by making the forward voltage drops through the two diodes 108 and 109 equal to the sum of the forward base-emitter voltage drops through the two transistors 89 and 92. In order to accomplish this with precision, the materials of the diodes should be the same as the transistor materials. In order to minimize temperature errors, silicon transistors and diodes should be used.

The output terminal 101 is connected through conductor 112 and capacitor 14 to the junction 13.

In the operation of the circuit of FIGURE 1, the signal to be integrated, or integrand signal, is applied between terminals 11 and 11'. The input can have any alternating or direct components, of any phase and either polarity. That is, the input voltage, $e_i$, is limited ideally only in accordance with the equality $$e_i = -RC\frac{de_0}{dt} \qquad (1)$$

in which R is the resistance of resistor 12, C is the capacitance of capacitor 14, and $$\frac{de_o}{dt}$$

is the rate of output potential change at terminal 101. In terms of output, $$e_0 = -\frac{1}{RC}\int e_i dt + e_s \qquad (2)$$

in which the constant of integration, $e_s$, is the potential of terminal 101 at the start of integration.

Figure 2:
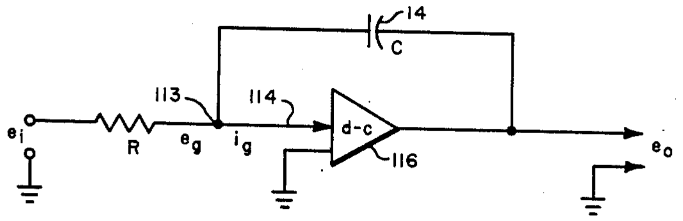
FIGURES 2 and 3 are generalized diagrams of the RC integrator.

The ideal integrator to which these equations apply is usually depicted as in FIGURE 2, in which the amplifier input potential, $e_g$, at junction 113 is zero, or at ground, the amplifier input current, $i_g$, in conductor 114, is zero, and the amplifier 116 inverts and has infinite gain. It is also possible to have perfect integration when $i_g$ is not zero, but constant, by adjusting the zero setting of the amplifier so that $e_g = -Ri_g$. It can then be shown that Equation 2 is still true.

When the amplifier 116 has a finite gain, G, and a step of voltage is applied to the input, the output voltage is $$e_0 = -G\left[1 - e^{\frac{-t}{(G+1)RC}}\right]e_i \qquad (3)$$

The product, RC, in Equations 2 and 3 determines the time constant of the integrator.

Figure 3:
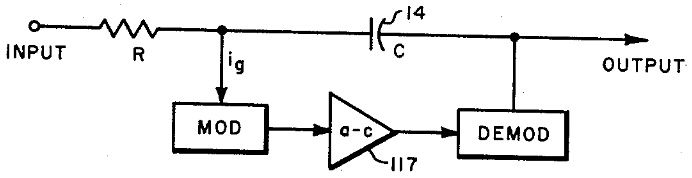

The amplifier 116 must maintain its small input current with great constancy. This generally requires constant attention. It is done manually only with difficulty. The same result is attained automatically, however, by substituting for a simple, direct-coupled amplifier an alternating current amplifier, which entails no voltage level problem, and using a modulator and a demodulator to transform the input signal to alternating current and the amplifier output signal back to direct current. The combination of modulator, amplifier and demodulator must invert the signal, so as to have feedback through the capacitor 14 in the negative sense. Such an amplifier is shown in block form in FIGURE 3.

When the demodulator output voltage is kept low, as it should be for greatest circuit simplicity and integration accuracy, and when a higher output voltage is required, an output direct-coupled amplifier can be added. Any amplifier drift at this point has no effect on increasing $i_g$. Use of such an amplifier also permits inversion to be effected in it. Such an integrator, including chopper modulator and chopper demodulator, is shown in FIGURE 4.

Figure 4:
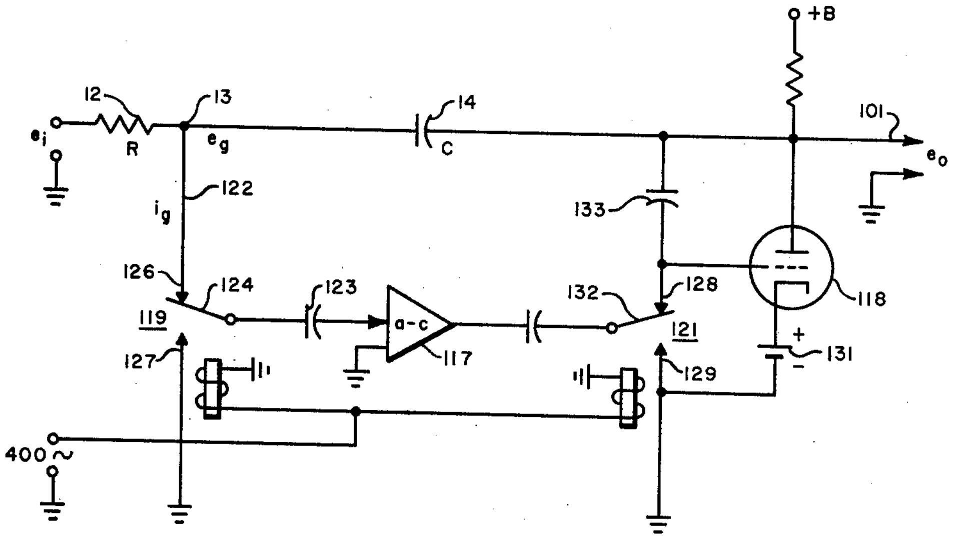
FIGURE 4 is a block diagram of another form of RC integrator.

In the circuit of FIGURE 4, the triode 118 comprises the direct-coupled amplifier. The switch or chopper 119 modulates the input signal $e_i$ at 400 c.p.s., thus converting it to alternating current for application to the amplifier 117. The switch 121 demodulates the 400 c.p.s. signal, being synchronous with switch 119, thus reconverting the signal to direct current. The contact arms of these switches can conveniently be operated in concert electrically as shown, or by securing them together mechanically and to the armature of a single vibrating relay.

A principal source of error in this circuit, causing the current $i_g$ in conductor 122 to differ from zero, is termed commutation leakage. This error is caused by the fact that current in conductor 122 charges the capacitor 123 when the armature 124 dwells on contact 126. This charge is not returned to conductor 122, but leaks off to ground when armature 124 dwells on contact 127. The value of this current is $$i_g = \frac{e_g}{4r} \qquad (4)$$

in which $r$ is the resistance to ground of the input to amplifier 117. It is therefore important to make this input resistance very high.

Another source of error, causing $e_g$ to be other than zero, occurs when the contacts 128 and 129 of chopper 121 are at different voltage levels. To remedy this, the local battery 131 is inserted in the tube cathode conductor, and is given a value such that the potential difference of contacts 128 and 129 throughout the range of required output variation will be as small as possible. When a difference of potential between contacts 128 and 129 exists, each time that the armature 132 moves from its lower to upper contacts it may draw a charge from capacitor 133, lowering $e_o$ and therefore lowering $e_g$. At equilibrium the potential $e_g$ will equal the difference in potential of contacts 128 and 129 divided by the gain of amplifier 117.

The error of the integrator is measured by the quantity $e_g + Ri_g$. If, therefore, the above two sources of error are made very small as indicated, both $e_g$ and $Ri_g$ become very nearly zero. It thus helps to make R small. The largest remaining source of error lies in departure from the ideal of the capacitor 14. Thus this integrator may be made to integrate with almost ideal precision.

The vibrating relays or choppers, 119 and 121, may be replaced by diode modulator and demodulator circuits having no moving parts. Although the choppers are primarily useful in the laboratory because of their precision, the diode components are preferred in the field because they are more reliable and have longer life. Such a diode modulator 16 is shown in FIGURE 1 and operates as follows. When the terminal 134 of the transformer secondary winding 38 is positive the diodes 28 and 29 become conductive, with approximately a 1-volt drop across them in series. Because of the level set by the grounded slider 34, the potential of the output junction 44 becomes zero. Also the diodes 23 and 24 are nonconductive, so that the junction 13, at potential $e_g$, is completely isolated from the output junction 43 and from ground. As the potential of transformer 134 sinusoidally approacches and reaches zero, then reverses to negative potential, the diodes 28 and 29 become nonconductive and the diodes 23 and 24 thereafter become conductive. This provides a conductive path between the output junction 43 and junction 13, so that the potential $e_g$ is impressed on capacitor 46 and is applied to the input of the alternating current amplifier 48. Thus, during alternate half cycles of the 400 c.p.s. supply the amplifier input is grounded while during the other half cycles the potential $e_g$ is impressed on the amplifier. At no time is the integrator input 11 grounded by the modulator. Since the input impedance as seen by the amplifier may be relatively low, pickup of stray fields is minimized.

The analysis of the errors of the circuit of FIGURE 4, and the measures required to minimize errors, apply to the modulator of FIGURE 1. The potential $e_g$ is reduced by the demodulator design, and $i_g$ is reduced in accordance with Equation 4 by making the input shunt resistance of amplifier 48 very high. When these and other measures are taken, as described in general in connection with FIGURE 4, the operation of modulator 16 is almost free of error.

The alternating current amplifier 48 is generally described above and in the reference. As depicted in FIGURE 1, the amplifier may have a voltage gain of about 100, which is adequate for most applications, and is noninverting. When the direct-coupled amplifier 88 is noninverting, the alternating current amplifier 48 may be made inverting by employing an amplifier with an odd number of common-emitter stages, or by adding a separate stage in addition to the amplifier 48.

In the operation of the demodulator 64, the transformer secondary winding 42 must be poled so that its terminal 136 is positive when terminal 134 of winding 38 is positive. During the half cycle when terminal 136 is positive, diodes 71 and 72 become conductive and diodes 68 and 69 nonconductive. Therefore, the input conductor 137 to the demodulator is connected to ground through junction 87 and diodes 108 and 109, setting the direct current level of junction 87 at about +1 volt. The demodulator output terminal 86, being isolated from the input by the nonconducting diodes 68 and 69, is maintained at a potential of about one volt above ground under control of the amplifier feedback circuit including capacitor 93. During the next half cycle of the 400 c.p.s. supply, the diodes 68 and 69 become conductive, connecting the demodulator input conductor 137 through junction 86 to the direct-coupled amplifier input base 96, and the diodes 71 and 72 become nonconductive.

The return of the demodulator output junction 87 to the 1-volt junction 111, as described, causes the average potentials of junction 87 and junction 86 to remain nearly the same at all times. If this were not so, the capacitor 93 would be charged and discharged once each cycle of the 400 c.p.s. supply. These pulsations would be coupled back through capacitor 14 to the junction 13, and would increase the average value of the potential $e_g$. Thus the return of the demodulator junction 87 to an elevated potential point tends to reduce the potential $e_g$, thus improving the accuracy of the integrator.

The functions of the direct-coupled amplifier 88 are threefold: it inverts so that the feedback through capacitor 14 is negative, and the amplifier amplifies the small signal output of the demodulator to the level required at the integrator output terminal 101. In addition, the amplifier provides smoothing or filtering of the demodulator output, eliminating the 400 c.p.s. ripple from the integrator output.

The demodulator output applied to the amplifier input base terminal 96 contains the integrand signal during alternate half cycles of the 400 c.p.s. supply, but during the other half cycles no signal is applied. During these half cycles, however, the potential existing at the integrator output terminal 101 is maintained by the smoothing action of the smoothing Miller capacitor 93. During those half cycles of the 400 c.p.s. supply when signal is applied to the direct-coupled amplifier, signal is also applied to the alternating current amplifier 48 and the loop is completely closed from the input terminal 11 through the modulator, alternating current amplifier, demodulator, direct-coupled amplifier and back through the feedback capacitor 14. During the other half cycles of the 400 c.p.s. supply the loop is broken at both the modulator and the demodulator and both the input and the output of the alternating current amplifier 48 are grounded.

What is claimed is:

An integrator comprising, an integrating resistor having an input signal applied to one terminal thereof, first, second, third and fourth modulator diodes, the cathodes of said first and third diodes and the anodes of said second and fourth diodes being connected to a common terminal, first capacitive means interconnecting the other terminals of said first and second diodes, second capacitive means interconnecting the other terminals of said third and fourth diodes, a center-tapped resistor interconnecting the other terminals of said first and fourth diodes, means connecting the center tap of said center-tapped resistor to the other terminal of said integrating resistor, a grounded center tap resistor interconnecting the other terminals of said second and third diodes, means applying a modulating alternating potential between said first and second capacitive means, an alternating current amplifier having its input connected to said common terminal, commutating synchronous demodulator means for converting the output of said alternating current amplifier to direct current, means applying said modulating alternating potential to said demodulator means causing said demodulator means and said modulator diodes to operate in synchronism, a capacitor having one terminal connected to said other terminal of the integrating resistor, and means applying the output of said demodulator means to the other terminal of said capacitor, said other capacitor terminal also constituting the integrator output terminal.

References Cited in the file of this patent

UNITED STATES PATENTS

| | | |
|---|---|---|
| 2,911,597 | Lehman | Nov. 3, 1959 |
| 2,955,265 | Lindsay | Oct. 4, 1960 |
| 2,957,980 | Steghart et al. | Oct. 25, 1960 |
| 2,961,610 | Hosenthien | Nov. 22, 1960 |
| 2,962,675 | Meyer | Nov. 29, 1960 |
| 3,005,163 | Dulberger et al. | Oct. 17, 1961 |
| 3,007,116 | Gerhard | Oct. 31, 1961 |
| 3,030,582 | Holcomb et al. | Apr. 17, 1962 |
| 3,058,068 | Hinrichs | Oct. 9, 1962 |
| 3,065,428 | Richman | Nov. 20, 1962 |

FOREIGN PATENTS

| | | |
|---|---|---|
| 527,042 | Canada | June 26, 1956 |

OTHER REFERENCES

"D-C Operational Amplifiers With Transistor Chopper," by Hockwald et al., Electronics, April 24, 1959, pp. 94–95.

"Electronic Analog Computers," by Korn and Korn, McGraw-Hill Book Co., Inc., 1956 (pages 242, 231–232 relied upon).